United States Patent [19]

Albanese

[11] 4,270,209
[45] May 26, 1981

[54] DIGITAL COMPRESSIVE RECEIVER

[75] Inventor: Damian F. Albanese, Chatsworth, Calif.

[73] Assignee: International Telephone and Telegraph Corporation, New York, N.Y.

[21] Appl. No.: 101,259

[22] Filed: Dec. 7, 1979

[51] Int. Cl.³ .................. H03H 15/00; H03K 3/84
[52] U.S. Cl. ....................... 375/96; 455/145; 375/115; 364/485; 324/77 B; 324/77 CS
[58] Field of Search ............ 375/1, 10, 96, 115, 375/121; 364/485, 550, 724, 728; 324/77 B, 77 C, 77 G, 77 H, 77 R; 455/145, 146, 147, 148

[56] References Cited

U.S. PATENT DOCUMENTS

| | | | |
|---|---|---|---|
| 2,882,395 | 4/1959 | White | 455/145 |
| 2,994,766 | 8/1961 | McCoy | 455/146 |
| 3,158,864 | 11/1964 | Lehan | 375/1 |
| 3,244,808 | 4/1966 | Roberts | 375/1 |
| 3,337,804 | 8/1967 | Palatinus | 324/77 C |
| 3,718,813 | 2/1973 | Williams, Jr. | 324/77 G |
| 3,729,738 | 4/1973 | Cross | 324/77 C |
| 4,031,462 | 6/1977 | Bouvier | 324/77 |
| 4,038,612 | 7/1977 | Borofka | 455/147 |

Primary Examiner—Benedict V. Safourek
Assistant Examiner—Stephen Chin
Attorney, Agent, or Firm—William T. O'Neil

[57] ABSTRACT

A compressive receiver for developing a series of time-based identifying pulses corresponding to discrete received signals having various frequencies within a predetermined band of surveillance. A multiple local oscillator function is included, effectively dividing the predetermined band of interest into small frequency increments, each of these local oscillator signals being coded by a pseudo-random coded sequence (bi-phase code) of maximal length. Each frequency increment thus developed is coded by this sequence delayed by one bit duration as compared to that applied to the local oscillator frequency immediately preceding it. A mixer receiving input signals in the band of interest, and also the multiple local oscillator signals thus generated and coded, has its output processed by a passive correlator which provides pulses at times determined by the frequencies extant in the input signal.

12 Claims, 4 Drawing Figures

DIGITAL COMPRESSIVE RECEIVER

BACKGROUND OF THE INVENTION

1. FIELD OF THE INVENTION

The invention relates to band surveillance receivers generally and more particularly to such receivers of the compressive type which convert discrete frequencies to corresponding pulse times for discrete identification.

2. DESCRIPTION OF THE PRIOR ART

In the prior art, compressive receivers are known. In general these have been implemented according to analog techniques. One such disclosure is contained in U.S. Pat. No. 2,882,395. The device described therein makes use of a linearly swept local oscillator feeding a mixer which also accepts signals in the band of surveillance. Resulting intermediate frequency signals are thereby time separated or "coded" according to the frequency of each received signal. When applied to a "dispersive network", i.e. a network which provides a time delay which is a linear function of frequency, the received frequencies are effectively spread along a time base and arranged in order of frequency. In a surveillance receiver, calibration of this time-base permits the identification of the particular frequency of every signal being received within the band of interest at any one time so that other equipment can be timed to monitor or otherwise process any such received signal.

One of the greatest difficulties in instrumenting a system such as described in the aforementioned U.S. Pat. No. 2,882,395, is the problem of obtaining adequate linearity of the frequency sweep "FM modulation". Small errors of departures from perfect linearity of the frequency sweep produce relatively large errors in signal relative timing at the output of the dispersive delay line. In fact, for signals at the input of the surveillance receiver which are relatively close in frequency, non-linearities in the frequency variation function can deteriorate the frequency resolving capability of the system to such an extent that close signals may not be separated at all when they appear as identification pulses at the output of the dispersive delay line.

A system disclosed in U.S. Pat. No. 4,038,612 provides substantial relief from that problem. In that patent, a zero crossing detector monitors the FM sawtooth of the system and detects errors from idealized crossover points throughout the FM sawtooth. Errors are integrated and fed back to the modulating sawtooth waveshape such that imperfections of that waveshape as well as inherent non-linearities in the voltage controlled oscillator which actually produces the FM ramp are compensated for.

While constituting a significant improvement, the system of U.S. Pat. No. 4,038,612 is nevertheless still an analog system insofar as the generation of the FM ramp is concerned. As long as the basic sawtooth FM ramp is employed in the compressive surveillance receiver configuration, the problem of its linearity continues to be a critical design consideration.

The linearizing of the FM ramp is a costly operation since the linearity requirement is severe. Moreover, even perfect linearity of the FM ramp leaves dispersive delay line linearity deviations essentially uncorrected.

The manner in which the present invention deals with the disadvantages of the prior art by providing a system based on a unique modulation and compression arrangement not requiring a linear FM ramp or a dispersive delay line will be described as this specification proceeds.

SUMMARY OF THE INVENTION

It may be said to have been the general object of the invention to provide a compressive surveillance receiver which exploits the characteristics of digital coding, especially pseudo-random coding and correlation to provide the time-based pulse indicia with suitable resolution without the need for extremely linear circuits as required by prior art devices for the purpose.

To accomplish the objective of the invention some concepts and structure from the radar art have been borrowed. Pseudo-random sequences are modulated onto multiple local oscillator signals. A relatively long, maximal length, pseudo-random sequence is generated using known techniques and this is applied to a delay device, such as a shift register, having a bit accommodation (length) equal to the number of bits in the said sequence. This sequence is allowed to "shift" its way through the register continuously, and if each stage thereof is tapped out, the pseudo-random sequence appears at each tap delayed by one bit as compared to the last previous tape and ahead one bit as compared to the next succeeding tap of the register. If there are N bits in the maximal length pseudo-random sequence, a frequency synthesizer is provided for producing N discrete frequencies in an arithmetic progression, the spacing between each of these frequencies being equal to the frequency width of the radio-frequency band throughout which surveillance is desired.

Each of the discrete local oscillator frequencies thus generated is separately modulated by the pseudo-random sequence at a corresponding discrete delay value. Since there are as many local oscillator frequencies in the aforementioned arithmetic progression as there are bits in the pseudo-random sequence, this modulation or coding of the local oscillator frequencies can be accomplished on a one-for-one basis. The coded local oscillator signals, after summation, are applied to a superheterodyne mixer which also receives whatever input signals are extant in the predetermined band of surveillance. The output of this mixer is applied to a matched filter, for example in the form of a tapped delay device, each tap of which is fed to a zero or 180° phase shift device discretely. The pattern of these phase shift devices essentially "stores" the pseudo-random sequence so that each of the variously delayed sequences used as modulations on the local oscillator frequencies correlates in this passive matched filter at a discrete delay value. Accordingly, a signal-identifying pulse may occur within the duration of each bit of the sequence depending upon which of the multiple oscillator frequencies it corresponds to.

The details of a typical implementation of the concepts of the invention will be understood from the description hereinafter.

DETAILED DESCRIPTION OF THE DRAWINGS

Figure 1:
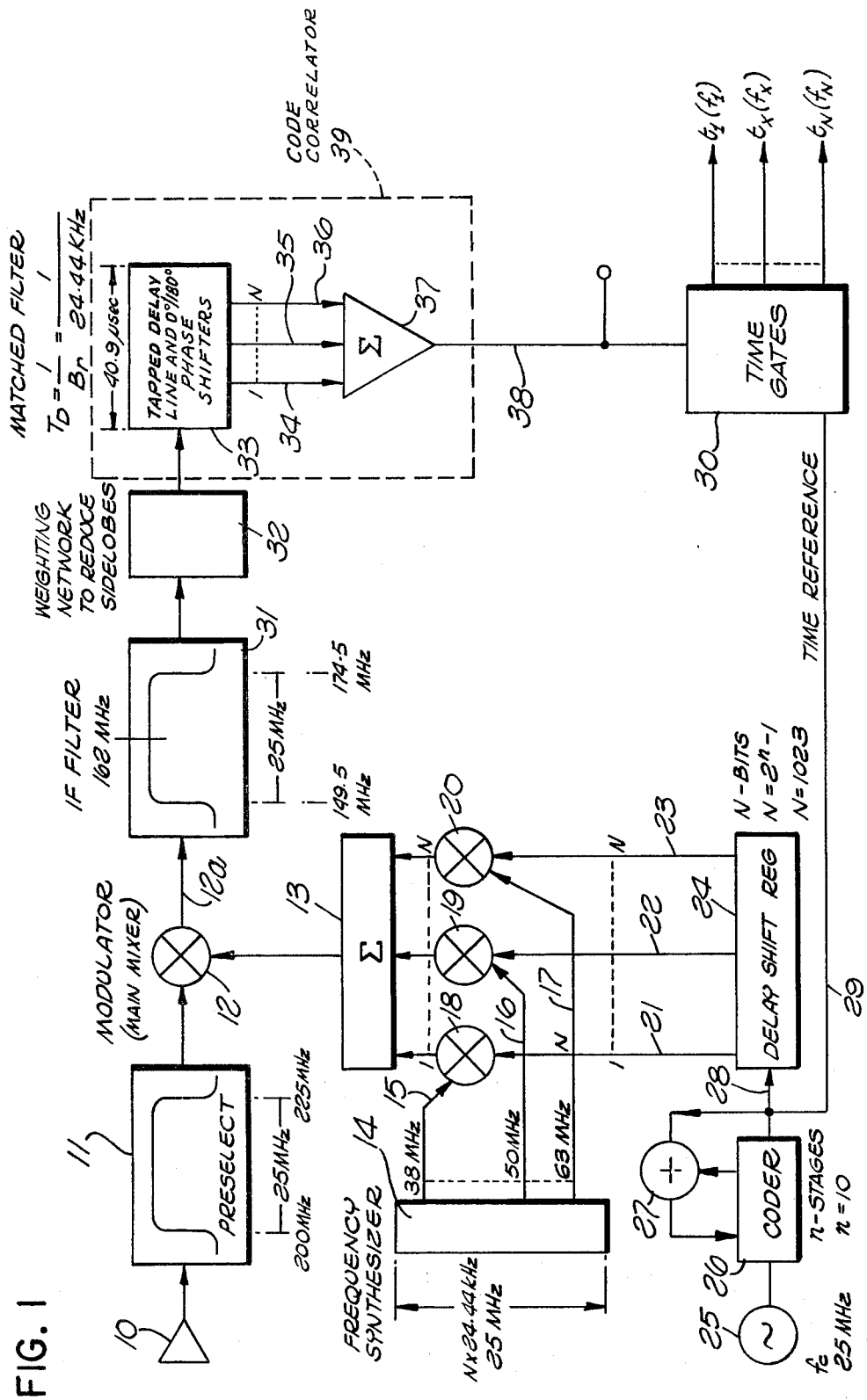
FIG. 1 is a schematic block diagram of the compressive receiver according to the invention.

Referring now to FIG. 1, it is assumed that signal surveillance is desired over a 25 MHz increment. This is for example, from 200 MHz to 225 MHz.

A conventional antenna 10 receives signals within this 25 MHz increment and passes them to a modulator (main mixer) 12, preferably through a preselection stage 11. This preselector has a bandpass of 25 MHz lying between the aforementioned 200 and 225 MHz limits (see also FIG. 2 for graphic illustration of this representation). A local oscillator signal comprising the sum of the predetermined number of frequencies each modulated by a digital code, for example a pseudo-random sequence, is supplied from the summer 13 to mixer 12.

The foregoing will be recognized as a super-heterodyne arrangement in which input signals within the described band-pass are in down-converted form at the mixer output 12a, however the special nature of the local oscillator signals at the output of summer 13 must be understood before the further processing of signals at mixer output 12a can be described.

In addition to the 25 MHz band of surveillance selected for this description, let it also be assumed that the resolution required (in frequency terms) is nominally approximately 25 kHz. There exists an interrelationship with the word length of the pseudo-random code generated at 28, this becoming clear as this description proceeds.

The code generated at 28 comprises a maximal length sequence, as that term is understood in the pulse-compression radar art. As such, the coded sequence is relatively long and begins anew immediately after the last bit of each code word, without hiatus between the code words of this sequence.

The selection of the code word to be generated is based upon the desired compression ratio to be achieved and the channel resolution required. The resolution is the reciprocal of the matched filter (delay line) length which is also the code word length. In the example, the delay line length is 40.9 microseconds and therefore the resolution is 24.44 kHz. The compression ratio is equal to the code word length which in this example is 1023 bits of 40 nanoseconds each.

Considering now the clock oscillator 25, a clock frequency $f_c$ of 25 MHz is therefore indicated. A 10-stage shift register 26 responsive to the clock oscillator 25 and having a feedback path including adder 27 is capable of generating this pseudo-random sequence. The configuration of this code generator producing the coded sequence at 28 is well known in the pulse-compression radar art. In the text "Radar Handbook" by Merrill I. Skolnik (McGraw-Hill Book Company 1970) the subject of phase-coded waveforms, pseudo-random codes (PRC) and code generators of the type required are discussed in Section 20.5 of that reference. FIG. 17 therein shows essentially the components 26 and 27 of the present FIG. 1.

Based on the 25 MHz clock $f_c$, and a 10-stage shift register for the coder at 26, it will be seen that the output 28 is a code of length $2^n - 1$, where n equals 10, or a total code length in bits of 1,023.

A delay shift register 24 has a capability of holding the full code word of 1,023 bits and is tapped at each stage so that there are N (1,023) taps. These are represented for N=1 at lead 21, for N=X at lead 22 and at the full delay of 1,023 bits at 23. Although 3 channels of PRC modulation coding are illustrated in FIG. 1, it is to be understood that there are in fact 1,023 in the system of the example. The 1,023 taps on the delay shift register 24, 3 of which are illustrated at 21, 22 and 23, each feed a corresponding local oscillator mixer, 18, 19 and 20, respectively. A frequency synthesizer 14 provides a "comb" of frequencies, one discrete frequency for each of the aforementioned oscillator mixers. The spacing of these output frequencies from 14 is 24.44 kHz, i.e. 1,023 discrete frequency outputs from 14 are mutually and uniformly spaced by that 24.44 kHz amount.

Note that each of the local oscillator mixers 18, 19 and 20, and of course the other 1,020 intervening ones which are not illustrated, is fed from an output from frequency synthesizer 14, for example 15, 16 and 17 as illustrated.

It has been pointed out that each of the code outputs of delay shift register 24 is successively delayed one bit as compared to the immediately preceding tap, that one bit amounting to 40 nanoseconds, so that when the full 1,023 bits have been traversed, the delay is $1,023 \times 40$ nanoseconds or 40.9 microseconds (the code word length in time). When the local oscillator mixer outputs are summed in the summer 13, the full 1,023 discrete local oscillator signals, each modulated by the pseudo-random sequence in the aforementioned successive delay arrangement, serve to correspondingly modulate signals within the incoming 25 MHz bandwidth such that the output 12a of mixer 12 contains IF domain pseudo-random code modulated signals in the 149.5 to 174.5 MHz region with center frequency of 162 MHz. The corresponding local oscillator frequencies from the synthesizer 14 responsible for the corresponding conversion to IF range from approximately 38 MHz to 63 MHz. The IF filter 31 can, and ordinarily would, contain intermediate frequency amplification.

Ignoring weighting block 32 for the moment, it will be noted that the output of the IF filter 31 is supplied to a code correlator 39.

Figure 2:
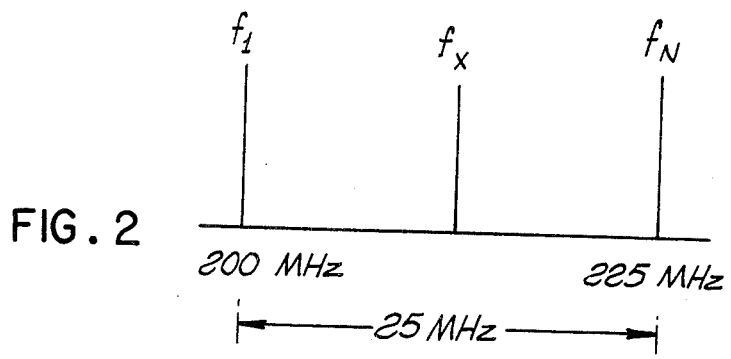
FIG. 2 is a representation of an assumed input signal distribution.

The IF signals from 31 have been seen to contain IF frequency signals discretely modulated by Psuedo-random coding with programmed delay for any signal supplied to the mixer 12 from the preselector 11 falling within the RF receiving band depicted in FIG. 2. The code correlator 39 is a matched filter (or tapped delay line) 40.9 microseconds in duration and tapped every 40 nanoseconds (at each successive bit duration). The code correlator 39 is preferably of the type described in the aforementioned radar handbook referenced at FIG. 19a in the same section of the text, namely Section 20.5. Not only does the code correlator 39 include a tapped delay line in 33, but also a series of zero or 180° phase shifters arranged to duplicate the bi-phase coding of the original pseudo-random sequence. Thus it may be said that the correlator 39 "stores" the original sequence extant at 28 in device 33.

Each successive matching at the code delay associated with the corresponding IF signal from 31 produces a correlation peak such as on lead 34, 35 or 36 or any of the other 1,020 outputs between 34 and 36. Summer 37 (within correlator 39) provides an output 38 which contains the essential timebase related output pulse information on lead 38. These pulses are graphically represented in FIG. 4.

Figure 4:
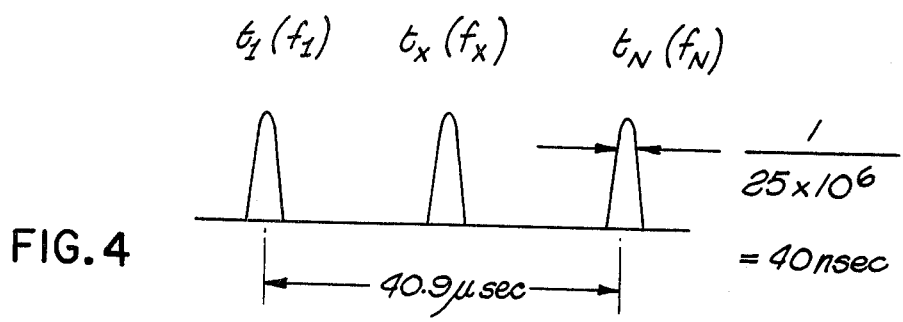
FIG. 4 is a typical output pulse representation corresponding to the input signal pattern of FIG. 2.

A time gating arrangement restarted with each repetition of the maximal pseudo-random sequence at 28 in accordance with a signal on lead 29 provides for the separation of the successive pulses identified as $t_1 (f_1)$, $t_x(f_x)$ and $t_N(f_N)$ as illustrated at the output of 30 and depicted graphically in FIG. 4.

Referring again to the IF filter 31, it will be realized that those incoming signals which are exactly 162 MHz from one of the local oscillator signals will fall exactly at IF midband (162 MHz). The IF filter, being 25 MHz wide, supports the code bandwidth. For the sake of an example, assume that two signals occurred at 200 MHz and at 200 MHz plus 25 MHz. The first signal would mix with local oscillator #1 nominally set at 38 MHz to produce a coded 162 MHz. The second signal would mix with local oscillator #2 at 38 MHz plus 25 kHz (actually 24.44 kHz) to produce a coded 162 MHz. Since local oscillator #2 is coded with a code delay one bit from that modulating local oscillator #1, the coded IF of signal #2 will be delayed one bit from that of signal #1. Both of these signals will be decoded by the code correlator; however, the correlated output of signal #2 will be delayed from that of signal #1 by one bit or 40 nanoseconds. In essence, it will be seen that the arrangement of FIG. 1 "maps" the incoming frequency domain into a time domain so that the frequency of each incoming signal can be identified. Note that input signal amplitudes are preserved.

Figure 3:
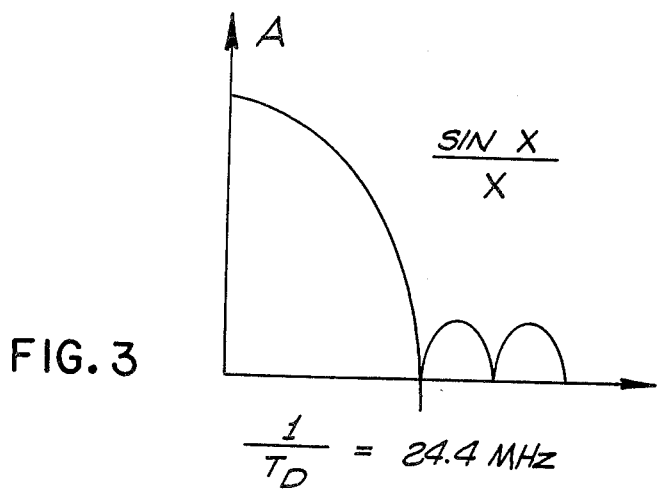
FIG. 3 is a frequency response representation for the matched filter of FIG. 1.

It will be further noted that the code correlator 39 is essentially frequency sensitive, the typical response thereof being depicted in FIG. 3. Accordingly, only those input signals which are exactly 25 kHz away from one of the coded local oscillators will produce maximum response out of the correlator. Those signals that result in intermediate frequencies that are more than 25 kHz up or down from the IF midband of 162 MHz will be diminished by the sidelobe level of the correlator line response. In order to reduce such sidelobe levels which are inherently undesirable, weighting as provided in block 32 may be provided. The process of weighting in the structure of weighting filter 32 is very well known in the related digitally coded CW radar art, the appropriate techniques being directly applicable in that respect.

The time gates embodied in 30 may be thought of as a commutated electronic switch, each output channel of which is enabled for the 40 nanoseconds of the corresponding code bit, seriatim.

The frequency synthesizer 14 may be implemented in any of a number of known forms such as multiple crystal oscillators or combinations of crystal oscillators with phase-lock-loop circuits operating therewith to produce the multiple discrete output frequencies. The instrumentation of frequency synthesizer 14 is thus conventional in the art.

Although the nature of the pseudo-random sequence has been identified as of the bi-phase coded type, it is conceivable that another type of successive digital coding might be applied. The delay shift register 24 alternatively could be an analog delay line arrangement, although a shift register is more easily constructed to provide the accurate 40 nanosecond bit durations adding up to the 40.9 microsecond overall code duration.

Still further, the passive matched filter arrangement prescribed for the code correlator 39 could be replaced by an active correlator in which the code 28 is supplied as the reference. Those of skill in the digital coding arts will recognize these and other possibilities for variations in the specific instrumentation in FIG. 1. Since those variations are possible within the skill of the art, it should be realized that the invention is not intended to be limited to the drawings or this description, these being regarded as typical and illustrative only.

In order to conduct surveillance over a greater band than the 25 MHz of the example, the frequency program of the multiple local oscillator (frequency synthesizer) signals could be modified and increased in number along with a corresponding increase in the length of the pseudo-random sequence. It is probably more practical however to provide for programmed switching of the frequency synthesizer outputs in synchronism with switching of the preselector band width to a different 25 MHz "slice" of the spectrum in order to obtain time-shared surveillance capabilities over a larger range of frequencies.

It will be noted that digital instrumentations are widely available and are currently accomplished at very low cost. Moreover, they provide for precise timing without the need for ultra-linear components such as dispersive delay lines used in prior art apparatus previously discussed.

What is claimed is:

1. A compressive surveillance receiver, comprising:
   frequency synthesizing means for generating a composite local oscillator signal including N discrete signal uniformly spaced in frequency;
   first means for generating a repetitive digitally coded sequence having N bits;
   second means responsive to said first means for providing N outputs, said coded sequence appearing at each of said N outputs in a delayed series whereby said coded sequence is extant at each successive output of said series delayed by one bit as compared to the preceding output in said series;
   third means for modulating each of said N discrete local oscillator signals by said coded sequence extant at a corresponding one of said N outputs of said second means to provide N modulated outputs;
   mixer means responsive to received input signals in a band of surveillance and to said third means outputs for converting said received input signals to signals in the intermediate frequency domain;
   and means comprising a matched filter responsive to said intermediate frequency signals for correlating all coded sequence modulated intermediate frequency signals extant at the output of said mixer and corresponding to said received input signals to provide output pulses at times which are a function of the corresponding delay of the coded sequence modulated onto each corresponding local oscillator signal generated by said frequency synthesizer.

2. A receiver according to claim 1 in which an intermediate frequency band-pass filter is included between said mixer and said matched filter, said filter having a pass band substantially equal to the predetermined band of frequencies of said surveillance.

3. A receiver according to claim 2 in which a preselection filter having substantially the same pass band as said intermediate frequency band-pass filter is included in the input signal path preceding said mixer.

4. A receiver according to claim 1 in which said matched filter comprises a delay line having a length in terms of time equal to the duration of said coded sequence and having N taps spaced by a time equal to the bit duration of said coded sequence, said matched filter also including a summer responsive to said N taps to produce a pulse corresponding to the correlation peak produced for each of said coded sequences, the output of said summer thereby providing a group of said pulses spaced along a time base and each analogous to the frequency of a corresponding received input signal.

5. Apparatus according to claim 2 including a preselector in the signal path ahead of said mixer means, said preselector having substantially the same bandwidth as said intermediate frequency band-pass filter.

6. Apparatus according to claim 4 including a preselector in the signal path ahead of said mixer means, said preselector having substantially the same bandwidth as said intermediate frequency band-pass filter.

7. A system according to claim 1 in which said matched filter comprises a delay device having a total delay equal to the duration of said coded sequence, N taps successively spaced one bit duration along said delay device and a bank of N fixed phase shifters connected one to each of said taps, said phase shifters being distributed in a pattern duplicating the phase sequence in each word of said coded sequence to provide correlation whenever a code word fills said delay device, N being the number of bits in a word of said coded sequence.

8. A system according to claim 7 in which said phase shifters as a group provide N outputs and in which a summer is provided responsive to said N phase shifter outputs, the output of said summer providing a correlation peak whenever said code word fills said delay device.

9. A system according to claim 8 in which said delay device is defined as a delay line.

10. A system according to claim 1 in which said first means comprises a pseudo-random sequence generator providing a maximal length sequence.

11. A system according to claim 10 in which said second means comprises a delay shift register responsive to said first means and said N outputs are taken from a corresponding series of taps, one from each stage of said register, thereby to provide said series of codes delayed by one bit each from the preceding output.

12. A system according to claim 8 in which said first means comprises a pseudo-random sequence generator providing a maximal length sequence and said second means comprises a shift register responsive to said first means for providing said N outputs each delayed one bit duration from the preceding output.

* * * * *